United States Patent
Wang et al.

(10) Patent No.: US 9,111,603 B1
(45) Date of Patent: Aug. 18, 2015

(54) SYSTEMS AND METHODS FOR MEMORY CONTROLLER REFERENCE VOLTAGE CALIBRATION

(75) Inventors: Xiaobao Wang, Cupertino, CA (US); Chiakang Sung, Milpitas, CA (US); Joseph Huang, Morgan Hill, CA (US)

(73) Assignee: Altera Corporation, San Jose, CA (US)

( * ) Notice: Subject to any disclaimer, the term of this patent is extended or adjusted under 35 U.S.C. 154(b) by 482 days.

(21) Appl. No.: 13/409,077

(22) Filed: Feb. 29, 2012

(51) Int. Cl.
*G11C 5/14* (2006.01)

(52) U.S. Cl.
CPC . *G11C 5/147* (2013.01); *G11C 5/14* (2013.01)

(58) Field of Classification Search
CPC ........ G11C 5/47; G11C 7/14; G11C 11/4099; G11C 16/28
USPC ...................... 365/189.09, 226, 210.1, 210.14
See application file for complete search history.

(56) References Cited

U.S. PATENT DOCUMENTS

| | | | |
|---|---|---|---|
| 7,002,869 B2 | 2/2006 | Zhang et al. | |
| 7,142,007 B2 | 11/2006 | Baecher et al. | |
| 7,410,293 B1 | 8/2008 | Santurkar et al. | |
| 7,884,637 B2 | 2/2011 | Jeong | |
| 7,952,944 B2 * | 5/2011 | Kim et al. | 365/189.17 |
| 2002/0136065 A1 * | 9/2002 | Messager | 365/189.09 |
| 2010/0271861 A1 * | 10/2010 | Kitagawa | 365/148 |
| 2011/0181348 A1 * | 7/2011 | Ashida | 327/541 |

* cited by examiner

*Primary Examiner* — Han Yang
(74) *Attorney, Agent, or Firm* — Jason Tsai; Treyz law Group

(57) ABSTRACT

An integrated circuit may include a memory controller that interfaces with memory via one or more ports. A given port may be coupled to a comparator that receives data signals from the memory and a reference voltage signal and produces a corresponding output signal that identifies whether the data signals are logic one signals or logic zero signals. The memory controller may include detection circuitry coupled to the port that produces a target reference voltage signal for calibration of the reference voltage signal. The memory controller may include circuitry that produces the reference voltage signal based on control signals received from control circuitry. The control circuitry may generate the control signals to calibrate the reference voltage signal based on the target reference voltage.

20 Claims, 9 Drawing Sheets

SYSTEMS AND METHODS FOR MEMORY CONTROLLER REFERENCE VOLTAGE CALIBRATION

BACKGROUND

Integrated circuits often contain memory controllers for interfacing with memory. In a typical system, an integrated circuit can be used to communicate with system memory. In particular, the integrated circuit includes a memory controller that serves as an interface between the integrated circuit and the system memory. As an example, a system with double data rate four synchronous dynamic random access memory (DDR4 SDRAM) can have a memory controller for interfacing with the DDR4 SDRAM. The integrated circuit also includes processing circuits that are configured to access system memory by sending memory access requests to the memory controller (i.e., the memory controller includes one or more ports each of which receives memory access requests from a respective processing module within the integrated circuit).

A memory controller includes physical interface circuitry for sending and receiving signals from the system memory via conductive paths. The physical interface circuitry is used to receive data signals from system memory. The data signals have corresponding voltages that are used to determine whether the data signals correspond to logic one values or logic zero values. For example, the physical interface circuitry often includes comparators that compare the data signals to a reference voltage.

It may be difficult to accurately determine whether the data signals correspond to logic one or logic zero values. For example, the voltage levels of data signals that are conveyed over the conductive paths can vary depending on the source resistance of a driver circuit in the system memory and the termination resistance of a receiver circuit in the memory controller. In this scenario, comparators that are used to determine the logic values of the data signals can potentially produce incorrect results.

SUMMARY

An integrated circuit may be used to communicate with memory. The integrated circuit may include a memory controller having memory interface circuitry that is operable to transmit and receive signals from the memory. The memory controller may include a port that receives signals from the memory. The signals received from the memory may include data signals that correspond to data stored in system memory. The port may be coupled to a comparator that receives the data signals and a reference voltage signal and produces a corresponding output signal that identifies whether the data signals are logic one signals or logic zero signals.

The memory controller may include detection circuitry coupled to the port. The detection circuitry may be operable to produce a target reference voltage signal based at least partly on a signal received from the memory at the port. The target reference voltage signal may be used by the memory controller to calibrate voltage levels of the reference voltage signal. The detection circuitry may, for example, include resistors coupled in series between the port and a positive power supply terminal. In this scenario, the resistors may form a voltage divider that produces the target reference voltage signal.

The memory controller may include reference circuitry having a plurality of transistors coupled in parallel between a positive power supply terminal and a power supply ground terminal. A resistor may be interposed between the plurality of transistors and the positive power supply terminal. The transistors and the resistor may form a circuit that produces the reference voltage signal. The resistance of the resistor and the amount of current drawn by the plurality of transistors from the positive power supply terminal may determine the voltage level of the reference voltage signal.

The plurality of transistors may receive control signals from control circuitry in the reference circuitry. The control signals may be generated by the control circuitry to selectively enable and selectively disable each of the transistors. By selectively enabling and selectively disabling the transistors, the control circuitry may control how much current is drawn by the transistors from the positive power supply terminal, thereby controlling the voltage level of the reference voltage signal.

The reference circuitry may include a comparator operable to receive the target reference voltage and the reference voltage from the plurality of transistors. The comparator may provide a corresponding comparator output signal to the control circuitry. The control circuitry may use the comparator output signal to generate the control signals during calibration of the reference voltage signal.

During a calibration procedure in which the reference voltage signal is calibrated, the memory controller may direct the memory to produce a static voltage signal such as a logic zero output signal. The static voltage signal may be used by the memory controller to generate the target reference voltage signal (e.g., using the detection circuitry). After the reference voltage signal is calibrated, the reference voltage signal may be stored in storage circuitry in the memory controller. The stored reference voltage signal may be used by the memory controller during normal operation (e.g., when fulfilling memory access requests) to determine whether data signals that are received from the memory correspond to logic one values or logic zero values.

Further features of the present invention, its nature and various advantages will be more apparent from the accompanying drawings and the following detailed description.

DETAILED DESCRIPTION

Embodiments of the present invention relate to integrated circuits that contain memory controllers. A memory controller may be used by storage and processing circuitry on an integrated circuit to interface with system memory. For example, processing circuitry may use the memory controllers to store data in the system memory or to read data from the system memory.

The storage and processing circuitry may send memory access requests to the memory controller. The memory access requests may include read access requests and write access requests. For example, processing circuitry may send a read access request to the memory controller to retrieve data from memory. The memory controller may receive the read access request and fulfill the read access request by providing control signals to system memory (e.g., the memory controller may receive the read access request and provide control signals to system memory that configure system memory to respond with the requested data). As another example, the master processing module may send a write access request to the memory controller along with corresponding write data to be loaded into system memory. The memory controller may receive the write access request and fulfill the write access request by configuring system memory to overwrite system memory at the specified address with the write data.

The memory controller may include ports that are coupled to respective storage and processing circuitry. For example, the memory controller may be coupled to multiple processing circuits that each require access to system memory. In this scenario, the memory controller may arbitrate between the processing circuits. For example, the processing circuits may be assigned relative priorities that are used by the memory controller to determine the order in which memory access requests are fulfilled.

Figure 1:
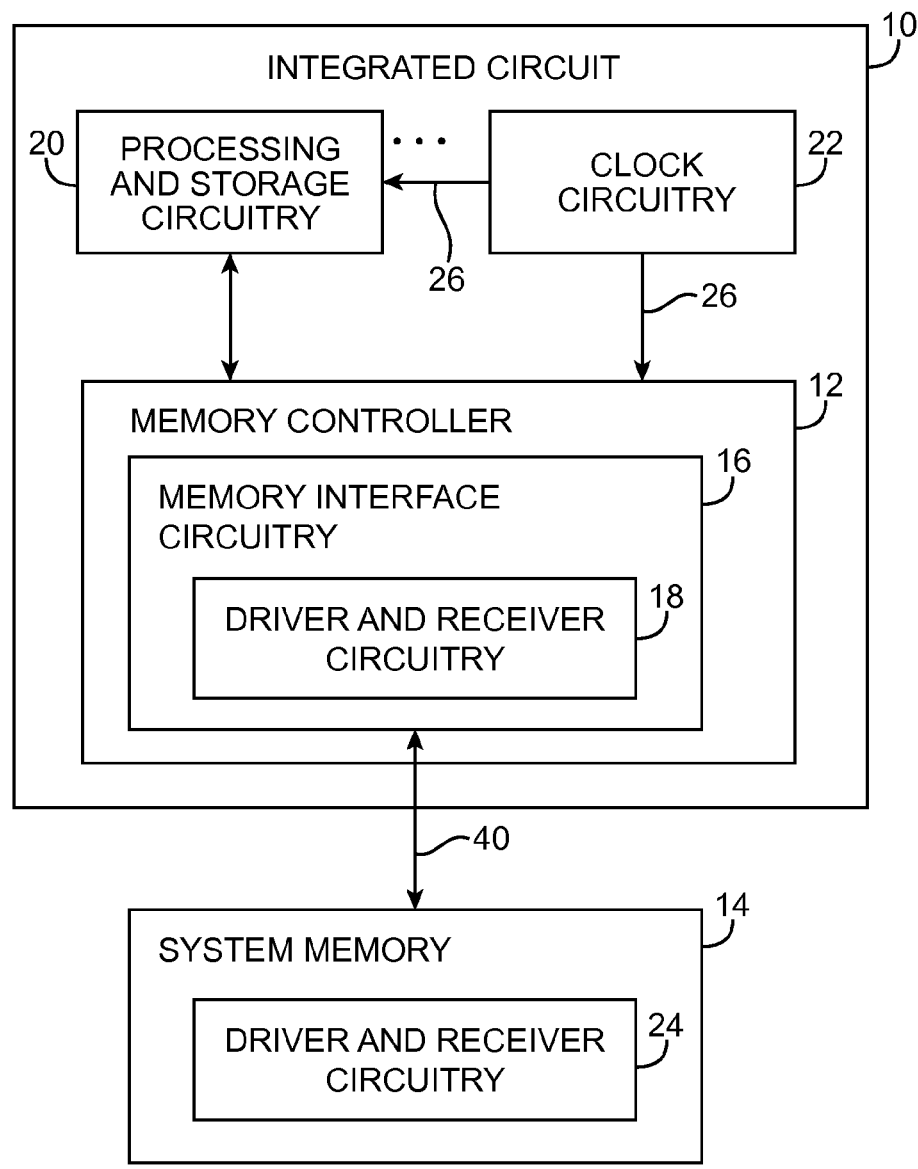
FIG. 1 is an illustrative diagram of an integrated circuit having a memory controller operable to communicate with system memory in accordance with an embodiment of the present invention.

Memory controllers may include memory interface circuitry for communicating with system memory. FIG. 1 is an illustrative diagram of an integrated circuit 10 having a memory controller 12 with memory interface circuitry 16. Memory interface circuitry 16 may be used to communicate with system memory 14 via paths 40. Paths 40 may, for example, include data paths used to transmit and receive data signals and control paths that are used to transmit control signals. As an example, memory controller 12 may fulfill a read access request received from processing and storage circuitry 20 by using memory interface circuitry 16 to provide appropriate control signals to system memory 14 that direct system memory 14 to provide requested data. In this scenario, memory controller 12 may receive the requested data from system memory 14 using memory interface circuitry 16.

Memory interface circuitry 16 may include driver and receiver circuitry 18 for conveying and receiving signals over paths 40. Driver circuitry 18 may be used to drive paths 40 with signals such as control signals and/or data signals that are received by corresponding receiver circuitry 24 in system memory 14. Receiver circuitry 18 may be used to receive signals such as data signals from system memory 14 (e.g., data signals that are driven onto paths 40 by driver circuitry 24 of system memory 14).

Device 10 may include clock circuitry 22 that generates clock signals for synchronous operation of circuitry on device 10. Clock circuitry 22 may provide the clock signals to circuitry on device 10 such as processing and storage circuitry 20 and memory controller 12 via clock paths 26. For example, clock circuitry 22 may provide memory controller 12 with one or more clock signals over path 26 that are used by memory controller 12 to operate memory interface circuitry 16 at frequencies associated with the clock signals.

Figure 2:
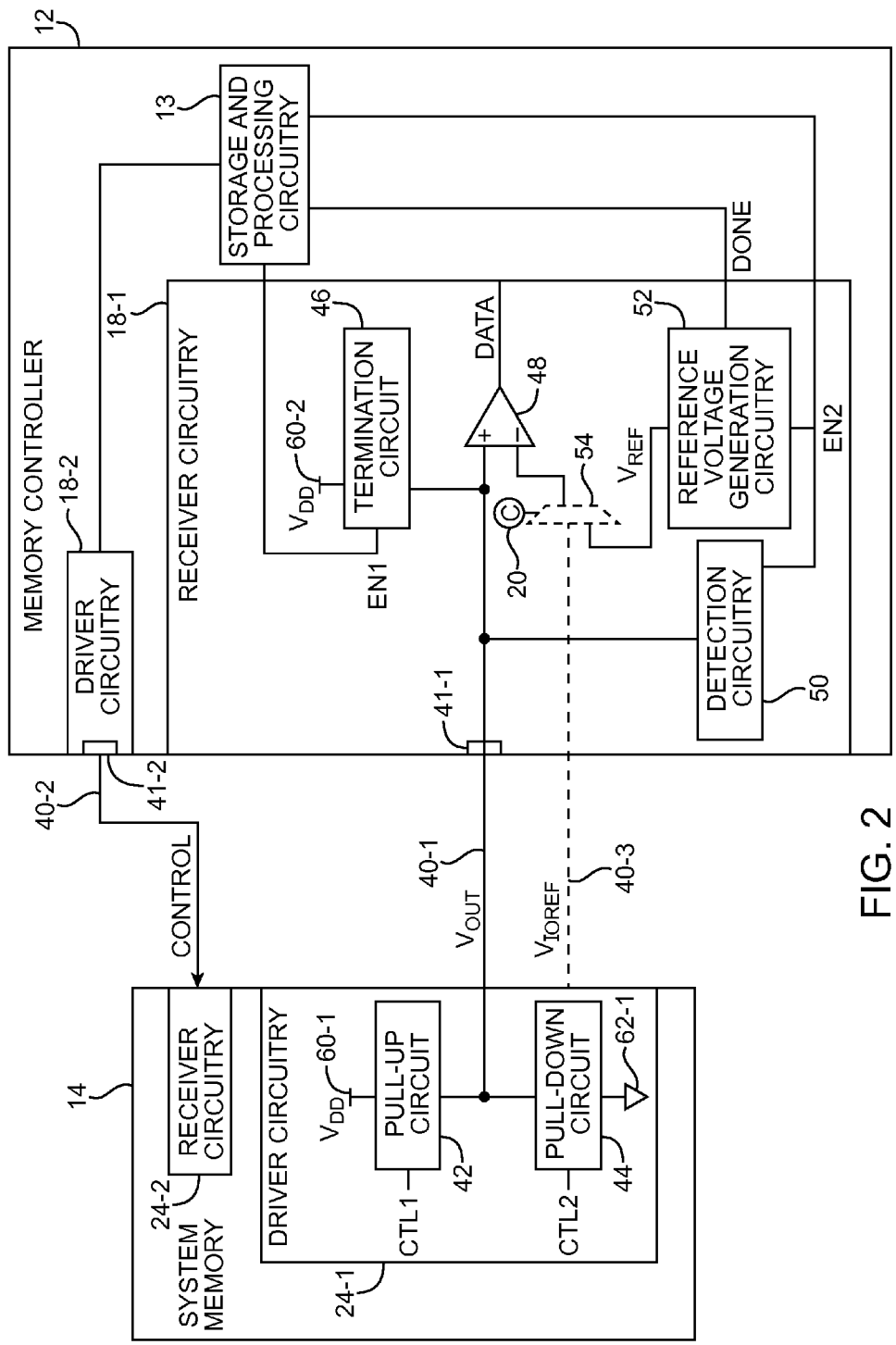
FIG. 2 is an illustrative diagram of a memory controller having driver and receiver circuitry operable to interface with system memory in accordance with an embodiment of the present invention.

FIG. 2 is an illustrative diagram of memory controller 12 that may be used to communicate with system memory 14. Memory controller 12 may include receiver circuitry 18-1 and driver circuitry 18-2. Receiver circuitry 18-1 may be used to receive signals over path 40-1 at port 41-1 from corresponding driver circuitry 24-1 on system memory 14. Driver circuitry 18-2 may be used to drive signals such as control signals onto path 40-2 via port 41-2 for reception by corresponding receiver circuitry 24-2 on system memory 14.

The example of FIG. 2 in which receiver circuitry 18-1 and driver circuitry 18-2 are formed separately is merely illustrative. If desired, receiver circuitry 18-1 and driver circuitry 18-2 may be formed as part of memory interface circuitry 16 of FIG. 1. Memory controller 12 may include additional driver and receiver circuitry for accommodating additional signal paths. For example, multiple signal paths 40 may be coupled between system memory and memory controller 12 for parallel transmission and reception of multiple data and/or control signals. If desired, additional driver circuitry may be coupled with corresponding receiver circuitry to a single signal path. For example, additional driver circuitry may be coupled to path 40-1 to transmit signals from memory controller 12 to system memory 14 over path 40-1. In this scenario, receiver circuitry 18-1 may be used to receive read data signals during signal reception operations (e.g., during fulfillment of read access requests) and the additional driver circuitry may be used to transmit write data signals during signal transmission operations (e.g., during fulfillment of write access requests).

Driver circuitry 24-1 may include pull-up circuit 42 and pull-down circuit 44 coupled in series between positive power supply terminal 60-1 and power supply ground terminal 62-1. Pull-up circuit 42 and pull-down circuit 44 may be controlled by control signals CTL1 and CTL2. This example is merely illustrative. If desired, pull-up circuit 42 and pull-down circuit 44 may be controlled by a single control signal (e.g., pull-down circuit 44 may be enabled when the control signal is asserted and pull-up circuit 42 may be enabled when the control signal is de-asserted).

Pull-up circuit 42 and pull-down circuit 44 may include components such as transistors, resistors, capacitors, or other circuit components. The components of pull-up circuit 42 and pull-down circuit 44 may collectively provide a driver source resistance of driver circuitry 24-1. As an example, pull-up circuit 42 may include a p-type transistor operable to receive control signal CTL1 and may include zero or more resistors coupled in series and/or in parallel with the p-type transistors. In this scenario, the output resistance of the p-type transistor and the resistance of the resistors may form a combined driver source resistance during signal pull-up operations (e.g., when output path 40-1 is driven with output signal VOUT having a logic one value). As another example, pull-down circuit 44 may include an n-type transistor operable to receive control signal CTL2 and may include zero or more resistors. In this scenario, the combined resistance of the n-type transistor and the resistors may form the driver source resistance during signal pull-down operations (e.g., when output path 40-1 is coupled to power supply ground terminal 62-1).

Pull-up circuit 42 may be used to drive signal path 40-1 with output signal VOUT having a logic one value. For example, control signal CTL1 may direct pull-up circuit 42 to form a path between power supply terminal 60-1 and signal path 40-1 (e.g., so that signal path 40-1 is driven with a positive power supply voltage). Pull-down circuit 44 may be used to drive signal path 40-1 with output signal VOUT having a logic zero value (sometimes referred to as a logic zero output voltage). For example, pull-down circuit 44 may be controlled via control signal CTL2 to couple power supply ground terminal 62-1 to signal path 40-1.

Receiver circuitry 18-1 may include termination circuit 46 coupled between positive power supply terminal 60-2 and signal path 40-1. Termination circuit 46 may include components such as transistors, resistors, and/or other components. The components of termination circuit 46 may provide a receiver termination resistance that, together with the driver source resistance of driver circuitry 24-1, may determine the voltage levels of signal VOUT.

As an example, during signal pull-down operations, termination circuit 46 and pull-down circuit 44 may be coupled in series between positive power supply terminal 60-2 of receiver circuitry 18-1 and power supply ground terminal 62-1 of driver circuitry 24-1. In this scenario, the voltage level of signal VOUT may have a value between the power supply voltage of positive power supply terminal 60-2 and ground terminal 62-1. The voltage level of signal VOUT may be determined by a ratio between the driver source resistance of pull-down circuit 44 and the termination resistance of termination circuit 46 (e.g., because termination circuit 46 and pull-down circuit 44 may form a voltage divider between power supply terminals 60-2 and 62-1).

During signal pull-up operations, pull-up circuit 42 may be coupled in series with termination circuit 46 between positive power supply terminal 60-1 of driver circuitry 24-1 and positive power supply terminal 60-2 of receiver circuitry 18-1. In this scenario, the voltage level of signal VOUT may be the same as power supply voltage VDD provided at positive power supply terminals 60-1 and 60-2.

Receiver circuitry 18-1 may include comparator 48 that is coupled to signal path 40-1. Comparator 48 may receive signal VOUT at a positive input and a reference voltage signal VREF at a negative input. Comparator 48 may compare signal VOUT to reference voltage signal VREF to retrieve data signal DATA from signal VOUT. For example, comparator 48 may produce signal DATA having a logic one value when the voltage level of signal VOUT is greater than the voltage level of reference voltage signal VREF. As another example, comparator 48 may produce signal DATA having a logic zero value when the voltage level of signal VOUT is less than or equal to the voltage level of reference voltage signal VREF.

Receiver circuitry 18-1 may include detection circuitry 50 and reference voltage generation circuitry 52 that may be used to calibrate the voltage level of reference voltage signal VREF. Memory controller 12 may include storage and processing circuitry 13 that provides control signals to driver circuitry 18-2 and receiver circuitry 18-1. For example, storage and processing circuitry 13 may provide enable signal EN1 to termination circuit 46 and may provide enable signal EN2 to detection circuitry 50 and reference voltage generation circuitry 52. This example is merely illustrative. If desired, storage and processing circuitry 13 may be formed as part of processing and storage circuitry 20 or other circuitry on device 10 that is coupled to memory controller 12.

Memory controller 12 may calibrate reference voltage signal VREF to help ensure that signal DATA is correctly retrieved from signal VOUT by comparator 48 (e.g., to help ensure that logic one voltages are greater than reference voltage signal VREF and that logic zero voltages are less than reference voltage signal VREF). Reference voltage signal VREF may be calibrated by directing system memory 14 to produce output signal VOUT having a logic zero value (e.g., by using storage and processing circuitry 13 providing appropriate control signals over signal path 40-2 using driver circuitry 18-2). System memory 14 may then provide control signal CTL2 to pull-down circuit 44 to form a path between signal path 40-1 and power supply ground terminal 62-1, thereby producing signal VOUT with a logic zero value (e.g., a logic zero output voltage). Detection circuitry 50 may be used to monitor voltage levels of signal VOUT and detect a reference voltage level based on the monitored voltage levels. The detected reference voltage level may be provided to reference voltage generation circuitry 52.

Reference voltage generation circuitry 52 may receive the detected reference voltage level from detection circuitry 50 and store the detected reference voltage level. Reference voltage generation circuitry 52 may include circuitry such as comparators, registers, combinational logic, and binary weighted transistors for converting the detected reference voltage into a digital value and storing the digital value. Receiver circuitry 18-1 may notify storage and processing circuitry 13 upon completion of calibration operations by asserting a DONE signal. Circuitry 52 may use the stored digital value to generate reference voltage signal VREF having been calibrated with the detected reference voltage level after reference signal calibration is complete (e.g., during normal operation of memory controller 12 such as fulfilling memory access requests).

The example of FIG. 2 in which reference signal VREF is directly provided to the negative input of comparator 48 is merely illustrative. If desired, optional multiplexing circuit 54 may be interposed between reference voltage generation circuitry 52 and the negative input of comparator 48. Multiplexing circuit 54 may receive reference voltage signal VREF from circuitry 52 and reference voltage signal VIOREF from system memory 14 over path 40-3. Multiplexing circuit 54 may be configured provide a selected one of the received reference signals to the negative input of comparator 48 for comparison with signal VOUT.

Optional multiplexing circuit 54 may be configured to provide either reference signal VREF or reference signal VIOREF to comparator 48 by a corresponding programmable element 20. Programmable element 20 may be based on any suitable programmable technology, such as fuses, antifuses, electrically-programmable read-only-memory technology, random-access memory cells, mask-programmed elements, etc. As an example, programmable element 20 may be formed from memory cells. During programming, configuration data is loaded into the memory cells using pins 14 and input-output circuitry 12. The memory cells are typically random-access-memory (RAM) cells. Because the RAM cells are loaded with configuration data, they are sometimes referred to as configuration RAM cells (CRAM). The example of optional multiplexing circuit 54 that is configured by programmable element 20 is merely illustrative. If desired, optional multiplexing circuit 54 may be configured by circuitry such as storage and processing circuitry 13 to route either reference voltage signal VREF or signal VIOREF to comparator 48.

If desired, system memory 14 may be provided with calibration circuitry for producing a reference voltage signal. For example, receiver circuitry 24-2 of system memory 14 may, if desired, be provided with calibration circuitry such as detection circuitry 50 and reference voltage generation circuitry 52. In this scenario, the calibration circuitry of system memory 14 may generate reference voltage signal VIOREF using receiver circuitry 24-2 and provide signal VIOREF to receiver circuitry 18-1 over path 40-3 using driver circuitry 24-1.

Figure 3A:
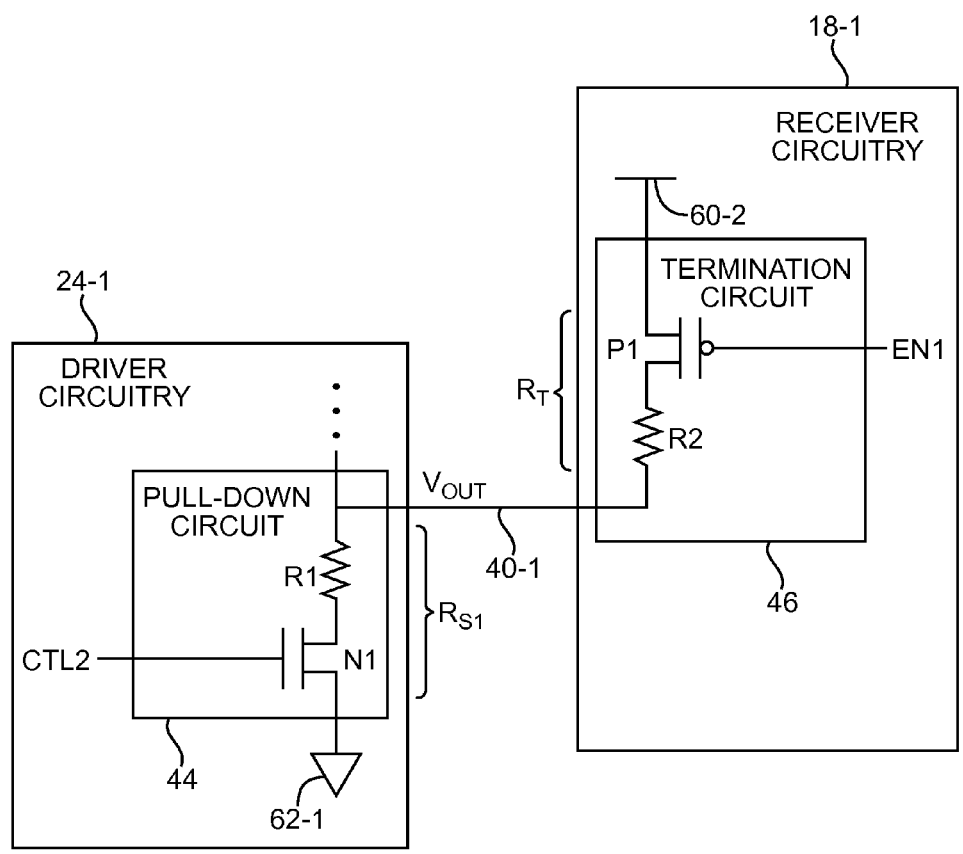
FIG. 3A is an illustrative diagram of receiver circuitry operable to receive logic zero signals from a pull-down circuit in accordance with an embodiment of the present invention.

The output voltage levels of signal VOUT may be at least partially determined by the ratio between driver source resistance of driver circuitry 24-1 and receiver circuitry 18-1. FIG. 3A is an illustrative diagram of driver circuitry 24-1 and receiver circuitry 18-1 during a signal pull-down operation (e.g., operations in which pull-down circuit 44 is enabled).

As shown in FIG. 3A, pull-down circuit 44 may include transistor N1 and resistor R1. Transistor N1 may be an n-type transistor that receives control signal CTL2 at a gate terminal of transistor N1. During signal pull-down operations, control signal CTL2 may be asserted, thereby enabling current flow through transistor N1 (e.g., current drawn from positive power supply terminal 60-2. The amount of current drawn by transistor N1 may be at least partly determined by characteristics of transistor N1 such as the width and the length of transistor N1 (e.g., the length between source and drain terminals of transistor N1). Transistor N1 and resistor R1 may have a combined source resistance RS1 (e.g., resistance RS1 may have a value that is the combined resistance of transistor N1 and resistor R1).

Termination circuit 46 may include transistor P1 (e.g., a p-type transistor) and resistor R2 that are coupled between signal path 40-1 and positive power supply terminal 60-2. Transistor P1 may receive enable signal EN1 that enables current flow through transistor P1 during reference signal calibration and during normal operation of receiver circuitry 18-1 (e.g., during fulfillment of memory access requests). For example, receiver circuitry may provide an enable signal having a logic zero value to a gate of p-type transistor P1 to enable current flow through source and drain terminals of transistor P1. Transistor P1 and resistor R2 may have a combined termination resistance RT. As an example, termination resistance RT may be the resistance of resistor R2 combined with the on-resistance of transistor P1.

The voltage levels of signal VOUT during signal pull-down operations (e.g., when a logic zero is driven onto path 40-1) may be determined by a ratio between source resistance RS1 and termination resistance RT. For example, pull-up circuitry such as pull-up circuit 42 of FIG. 2 may be disabled during signal pull-down operations and therefore pull-down circuit 44 may provide most or all of the driver source resistance of driver circuitry 24-1. In particular, the voltage level of signal VOUT when transistor N1 and P1 are enabled may be equal to the power supply voltage provided at terminal 60-2 multiplied by the ratio between source resistance RS1 and the sum of source resistance RS1 and termination resistance RT. As an example, if source resistance RS1 is equal to termination resistance RT, the voltage level of signal VOUT may be half of the power supply voltage provided at terminal 60-2. As another example, if source resistance RS1 is greater than termination resistance RT, the voltage level of signal VOUT may be greater than half of the power supply voltage.

The example of FIG. 3A in which pull-down circuit is formed from transistor N1 and resistor R1 and in which termination circuit 46 is formed from transistor P1 and resistor R2 is merely illustrative. Pull-down circuit 44 and termination circuit 46 may include any desired number of transistors, resistors, and other components for transmitting and receiving signal VOUT. Source resistance RS1 may have a value equal to the combined resistance of circuit components that are coupled between signal path 40-1 and power supply ground terminal 62-1 of pull-down circuit 44. Termination resistance RT may have a value equal to the combined resistance of circuit components that are coupled between signal path 40-1 and positive power supply terminal 60-2 of termination circuit 46.

Figure 3B:
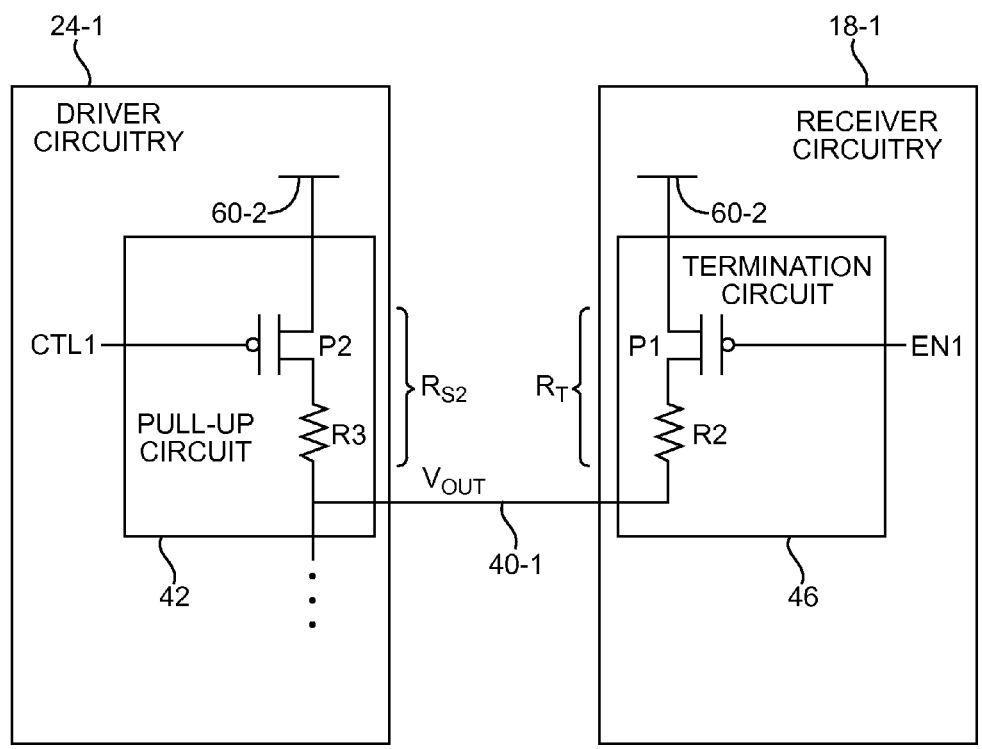
FIG. 3B is an illustrative diagram of receiver circuitry operable to receive logic one signals from a pull-up circuit in accordance with an embodiment of the present invention.

FIG. 3B is an illustrative diagram of receiver circuitry 18-1 and driver circuitry 24-2 during pull-up operations (e.g., when pull-up circuit 42 is enabled and pull-down circuit 44 is disabled). As shown in FIG. 3B, pull-up circuit 42 may include transistor P2 (e.g., a p-type transistor) and resistor R3 that have a combined driver source resistance RS2 during signal pull-up operations (e.g., when control signal CTL1 enables current flow through transistor P2). During the signal pull-up operations, the voltage level of signal VOUT may rise to the power supply voltage provided at positive power supply terminals 60-1 and 60-2.

It may be desirable to generate a voltage reference that is halfway between logic zero voltage levels (e.g., voltage levels of signal VOUT during signal pull-down operations) and logic one voltage levels (e.g., voltage levels of signal VOUT during signal pull-up operations). However, the midpoint between logic zero and logic one voltage levels may vary depending on the source and termination resistances of driver circuitry 24-1 and receiver circuitry 18-1. For example, driver circuitry 24-1 of different system memories 14 may have different source resistances. The source resistances may be 34 ohms or 40 ohms, as examples. Termination circuit may also be formed with different termination resistances such as 60 ohms or 120 ohms.

Figure 4:
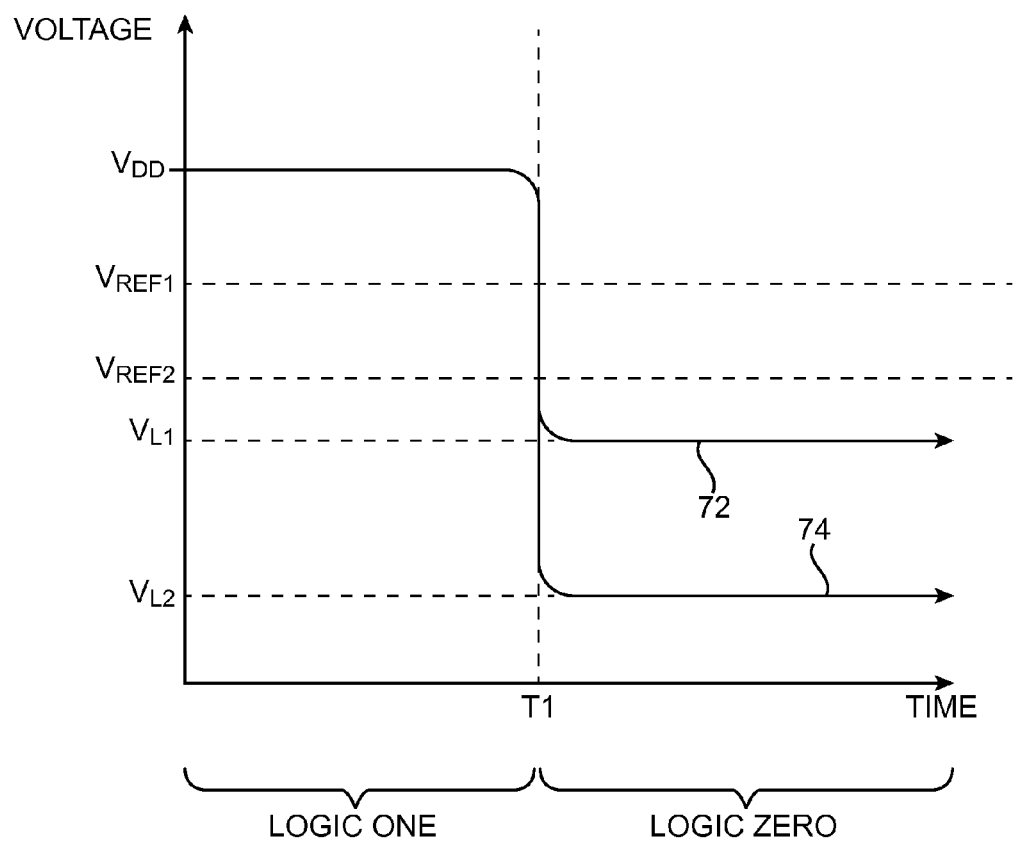
FIG. 4 is an illustrative graph of voltage levels of logic one and logic zero signals that are received by receiver circuitry for different source and termination resistances in accordance with an embodiment of the present invention.

FIG. 4 is an illustrative diagram showing how the voltage swing between logic one and logic zero values of signal VOUT may vary depending on source and termination resistances. The diagram of FIG. 4 shows voltage levels of signal VOUT of FIGS. 3, 3A, and 3B for signal pull-down operations (e.g., labeled as logic zero) and for signal pull-up operations (e.g., labeled as logic one). At times before time T1, driver circuitry 24-1 may drive a logic one onto path 40-1 (e.g., in the configuration of FIG. 3A). At times after time T1, driver circuitry 24-1 may drive a logic zero onto path 40-1 (e.g., in the configuration of FIG. 3B).

Lines 72 and 74 may correspond to voltage levels associated with different ratios between source and termination resistances. Line 72 may correspond to a scenario in which the driver source resistance during signal pull-down operations is relatively large and the termination resistance is relatively small. For example, line 72 may correspond to a scenario in which driver source resistance RS1 is 40 ohms and termination resistance RT is 60 ohms. In this scenario, the voltage level of line 72 (e.g., voltage levels of signal VOUT) may range between power supply voltage VDD and logic zero voltage VL1. Voltage VL1 may be equal to power supply voltage VDD multiplied by 40 ohms and divided by the sum of 40 ohms and 60 ohms (e.g., approximately 0.4 times VDD).

Line 74 may correspond to a scenario in which the driver source resistance when a logic zero is driven onto path 40-1 (e.g., during signal pull-down operations) is relatively small and the termination resistance of receiver circuitry 18-1 is relatively large. For example, line 74 may correspond to a scenario in which driver source resistance RS2 is 34 ohms and termination resistance RT is 120 ohms. In this scenario, the voltage levels of signal VOUT may vary between power supply voltage VDD and logic zero voltage VL2. Voltage VL2 may be equal to power supply voltage VDD multiplied by 34 ohms and divided by the sum of 34 ohms and 120 ohms (e.g., approximately 0.22 times VDD).

Power supply voltage VDD and output signal VOUT may change with temperature variations, capacitive coupling of signals from other circuitry on device 10, or other sources of noise. To accommodate variations in power supply voltage VDD and signal VOUT, reference voltage signal VREF may be generated so that sufficient margin is provided between reference voltage signal VREF and both the logic one voltage (e.g., power supply voltage VDD) and the logic zero voltage (e.g., voltage VL1 or VL2).

In some scenarios, it may be desirable to generate a reference voltage (e.g., the voltage of signal VREF of FIG. 2) that is the average of the voltage level associated with a logic one and the voltage level associated with a logic zero. For example, reference voltage signal VREF1 may be halfway between power supply voltage VDD and voltage VL1 for the scenario associated with line 72 and voltage reference VREF2 may be generated halfway between voltage VDD and voltage VL2 for the scenario associated with line 74. However, this example is merely illustrative. If desired, reference voltages VREF1 and VREF2 may be generated based on estimated and/or monitored variations in the logic one voltage and the logic zero voltage to provide sufficient margins so that logic one values and logic zero values are more accurately retrieved by receiver circuitry such as circuitry 18-1.

Figure 5:
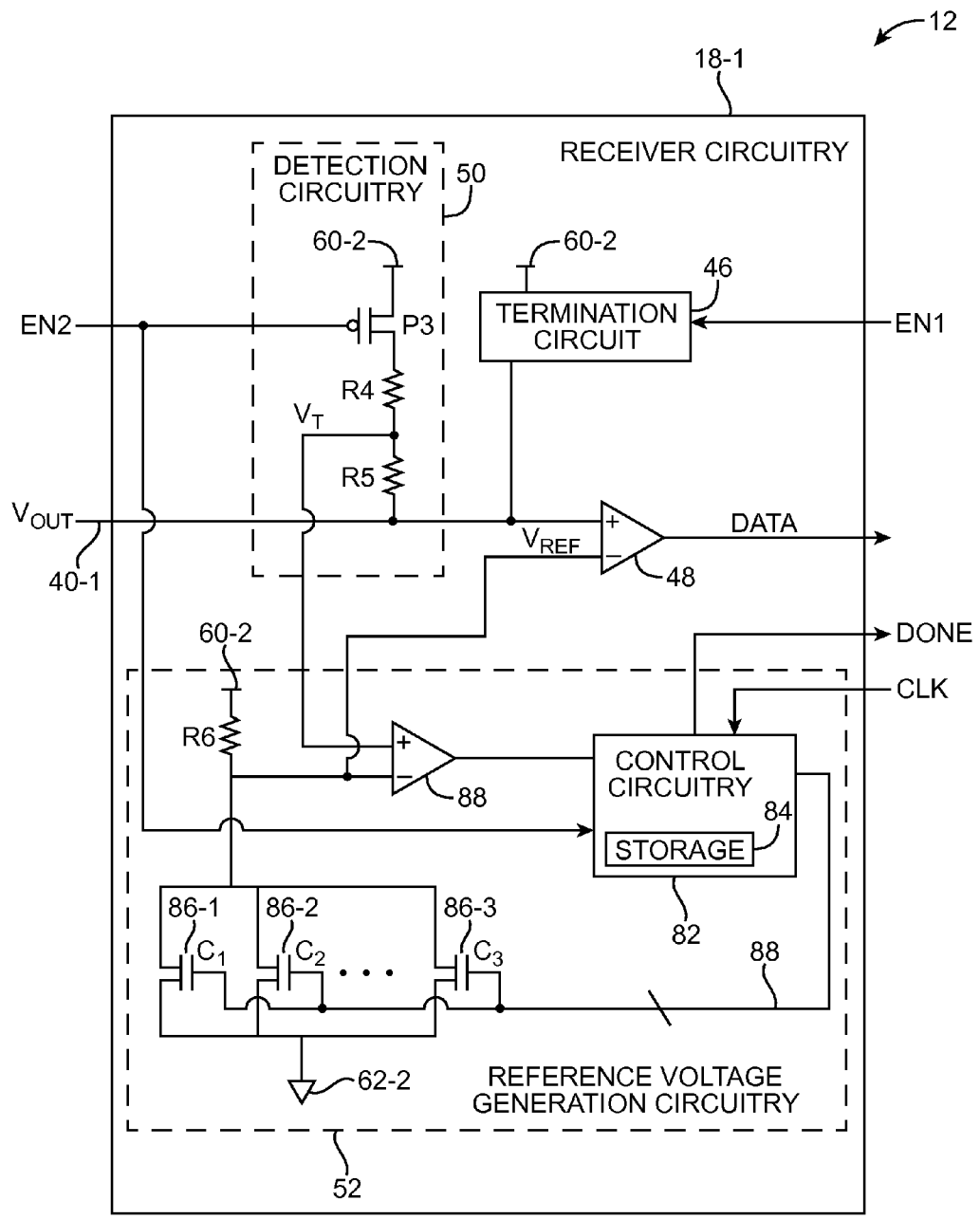
FIG. 5 is an illustrative diagram of receiver circuitry operable to calibrate a reference voltage signal that is used to retrieve information from received signals in accordance with an embodiment of the present invention.

FIG. 5 is an illustrative diagram of receiver circuitry 18-1 that may be used to generate a reference voltage signal VREF having sufficient margins for more accurate retrieval of data from signal VOUT by comparator 48. As shown in FIG. 5, detection circuitry 50 may include transistor P3, resistor R4, and resistor R5 that are coupled in series between positive power supply terminal 60-2 and signal path 40-1. Transistor P3 may receive enable signal EN2 (e.g., from control circuitry such as storage and processing circuitry 13 of FIG. 2).

Resistors R4 and R5 may be formed having relatively high resistances compared to the termination resistance associated with termination circuit 46. As an example, resistors R4 and R5 may be formed having resistances of one kilohm, two kilohms, six kilohms, or more, whereas termination circuit 46 may be formed having a termination resistance of only 60 ohms. In this scenario, detection circuitry 50 may insubstantially affect voltage VOUT of path 40-1 (e.g., because a relatively insubstantial amount of current flows through resistors R4 and R5 that have a large resistance compared to the current flowing through termination circuit 46 that has a small resistance).

Resistors R4 and R5 may form a resistive divider that produces a detected signal VT having a voltage that is equal to the difference between the power supply voltage at terminal 60-2 and the voltage of signal VOUT that is multiplied by the resistance of resistor R5 divided by the sum of the resistances of resistors R4 and R5. Consider the scenario in which the resistances of resistors R4 and R5 are the same. In this scenario, the voltage of signal VT may be halfway between the voltage of signal VOUT and the power supply voltage of positive power supply terminal 60-2 (e.g., half of the difference between the voltage of signal VOUT and the power supply voltage).

Detection circuitry 50 may provide detected signal VT to reference voltage generation circuitry 52, which may use signal VT as a target reference voltage signal for generating reference voltage signal VREF. Target reference voltage signal VT may be received at a positive input terminal of comparator 88. Comparator 88 may receive reference voltage signal VREF at a negative input terminal. Comparator 88 may provide an output signal to control circuitry 82 that is asserted when target reference voltage signal VT is greater than reference voltage signal VREF and is de-asserted when target reference voltage signal VT is less than or equal to reference voltage signal VREF.

Reference voltage generation circuitry 52 may include resistor R6 and a set of transistors 86 (e.g., a set including transistors 86-1, 86-2, and 86-3). Resistor R6 and the set of transistors 86 may be coupled between positive power supply terminal 60-2 and power supply ground terminal 62-2. Transistors 86 may be coupled in parallel between resistor R6 and power supply ground terminal 62-2. Transistors 86 may collectively draw current from positive power supply terminal 60-2 and thereby produce reference voltage signal VREF from a voltage drop associated with resistor R6.

The gate terminals of transistors 86 may each receive a respective control signal from control circuitry 82 over paths 88. For example, transistor 86-1 may receive control signal C1 over path 88 from control circuitry 82, transistors 86-2 may receive control signal C2, and transistors 86-3 may receive control signal C3. Control circuitry 82 may adjust control signals C1, C2, and C3 to selectively enable and disable transistors 86. For example, transistors 86 may be n-type transistors. In this scenario, control circuitry 82 may enable transistors 86-1 and 86-2 and disable transistor 86-3 by asserting control signals C1 and C2 and de-asserting control signal C3 (e.g., transistors 86-1 and 86-2 may be configured by control signals C1 and C2 to pass current, whereas transistor 86-3 may be configured by control signal C3 to block current flow).

Control circuitry 82 may receive a clock signal CLK from circuitry such as clock circuitry 22 of FIG. 1. Control circuitry 82 may generate (e.g., adjust) control signals C1, C2, and C3 based on the received clock signal. For example, control circuitry 82 may adjust control signals C1, C2, and C3 synchronously with the received clock signal. This example is merely illustrative. If desired, control circuitry 82 may adjust control signals that are provided to transistors 86 asynchronously.

Each of transistors 86 may draw a predetermined amount of current when enabled and may draw a minimal amount of current when disabled. The amount of current of a given transistor may be determined by transistor characteristics such as width and length. The voltage of reference voltage signal VREF may be dependent on the total current that is drawn by transistors 86 (e.g., the sum of the currents that are drawn by each of transistors 86), the power supply voltage provided at terminal 60-2, and the resistance of resistor R6. In particular, the voltage of reference voltage signal VREF may be equal to the total current drawn by transistors 86 multiplied by the resistance of resistor R6 and subtracted from the power supply voltage. By increasing the total current drawn by transistors 86, the voltage of reference voltage signal VREF may be reduced. By decreasing the total current drawn by transistors 86, the voltage of reference voltage signal VREF may be increased.

Control circuitry 82 may adjust the control signals that are provided to transistors 86 so that reference voltage signal VREF is produced at a desired voltage level. Consider the scenario in which the current reference voltage signal VREF is less than target reference voltage level VT. In this scenario, comparator 88 may indicate to control circuitry 82 that reference voltage signal VREF should be increased. To increase the voltage of reference voltage signal VREF, control circuitry 82 may disable one or more transistors 86 and/or replace currently enabled transistors by enabling transistors that draw less current.

As another example, control circuitry 82 may reduce the current reference voltage signal VREF by enabling one or more additional transistors 86, thereby increasing the current draw of transistors 86 and reducing the voltage of reference voltage signal VREF. Alternatively, control circuitry 82 may disable one or more currently enabled transistors and enable one or more transistors that have greater current draw, thereby increasing the net current draw of transistors 86 and reducing the voltage of reference voltage signal VREF. By selectively disabling and enabling transistors 86, control circuitry 82 may adjust the total amount of current drawn by transistors 86, thereby controlling the voltage of reference voltage signal VREF.

Control circuitry 82 may include storage circuitry 84 for storing data from which control signals that are provided to transistors 86 are generated. For example, the stored data may be used to generate control signals C1, C2, and C3 during a normal operation of receiver circuitry 18-1 so that reference voltage signal VREF is produced at a desired voltage level.

In some scenarios, it may be desirable to generate control signals C1, C2, and C3 that correspond to binary digits (e.g., because storage circuitry 84 may store data in binary form). To accommodate binary control signals, transistors 86 may be formed so that the current draw of successive transistors 86 is decreased by a factor of two. Configurations in which the current draw of successive transistors 86 is increased or decreased by a factor of two may sometimes be referred to as binary weighted configurations (e.g., transistors 86 may be referred to as binary weighted transistors).

The current drawn by a given transistor 86 may be proportional to the sizing of that transistor. For example, the current drawn by transistor 86-1 may be proportional to the ratio between the width and the length (e.g., the length between the source and drain) of that transistor. Binary weighted transistors may be formed so that the width of successive transistors is decreased by a factor of two so that the current drawn by successive transistors are decreased by a factor of two.

As an example, transistor 86-3 may have a given current draw (e.g., a given width), transistor 86-2 may have half the current draw of transistor 86-3 (e.g., half the given width), and transistor 86-1 may have half the current draw of transistor 86-2 (e.g., one fourth of the current draw of transistor 86-3 and one fourth of the given width). This example is merely illustrative. If desired, transistors 86 may have any desired weighting.

Binary weighted transistors 86 may be controlled by control circuitry 82 to produce reference voltage signal VREF within a range of voltages. The minimum voltage within the range that can be produced by transistors 86 may correspond to the current drawn from power supply terminal 60-2 when all of transistors 86 are enabled. The maximum voltage that can be produced by transistors 86 may correspond to the current drawn from power supply terminal 60-2 when all of transistors 86 are disabled.

The example of FIG. 5 in which transistors 86 include three transistors (e.g., transistors 86-1, 86-2, and 86-3) is merely illustrative. If desired, reference voltage generation circuitry 52 may be formed with any desired number of transistors 86 that are selectively enabled and disabled by control circuitry 82. In other words, control circuitry 82 may be configured to provide any desired number of control signals for selectively enabling and selectively disabling respective transistors 86. The number of transistors 86 that are formed may determine the voltage range of reference voltage signal VREF and/or the precision with which control circuitry 82 can adjust reference voltage signal VREF. For example, reference voltage generation circuitry 52 having an increased number of transistors 86 can potentially produce a smaller reference voltage signal VREF, because the increased number of transistors 86 can be enabled to draw a greater amount of current from power supply terminal 60-2. As another example, circuitry 52 having an increased number of transistors 86 can potentially provide improved precision within the voltage range, because there are more possible combinations of enabled and disabled transistors (e.g., there may be additional levels of current that can be drawn by transistors 86).

Figure 6:
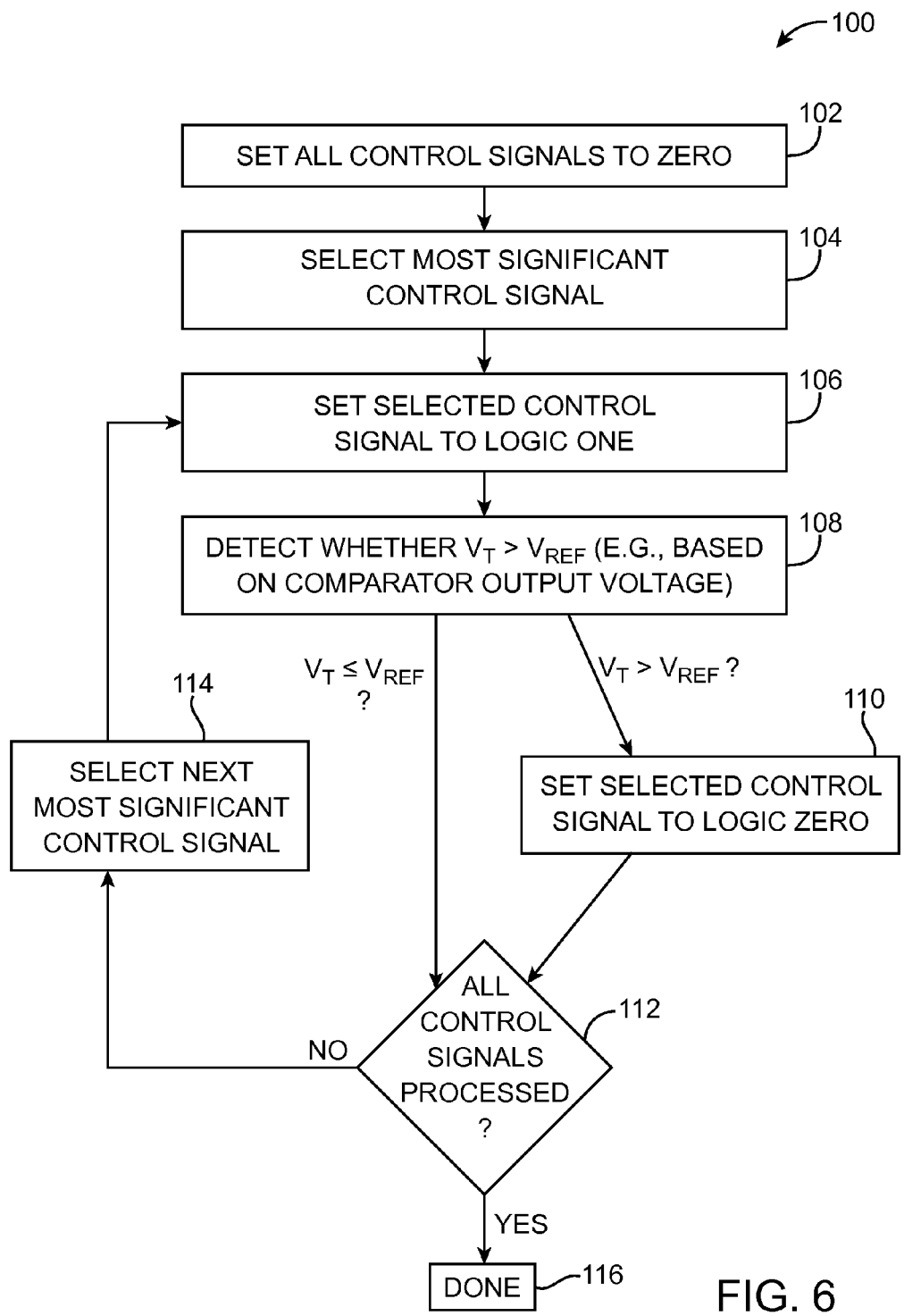
FIG. 6 is a flow chart of illustrative steps for calibrating a reference voltage signal based on a detected target reference voltage signal in accordance with an embodiment of the present invention.

In scenarios in which transistors 86 form weighted configurations such as binary weighted configurations, control circuitry 82 may be used to calibrate reference voltage signal VREF by adjusting each of control signals C1, C2, and C3 that are provided to transistors 86. FIG. 6 is a flowchart 100 of illustrative steps that may be performed by control circuitry 82 to calibrate reference voltage signal VREF. In the example of FIG. 6, the steps of flowchart 100 may be described for a binary weighted configuration in which transistor 86-3 draws the most amount of current when enabled, transistor 86-2 draws half the amount of current as transistor 86-3 when enabled, and transistor 86-1 draws one fourth the amount of current as transistor 86-3 when enabled. This example is merely illustrative. If desired, the steps of flowchart 100 may be performed for any desired weighted configurations of transistors 86.

Control signals C1, C2, and C3 that are provided to weighted transistors may sometimes be referred to as control bits. In the scenario of FIG. 6, control signal C3 may sometimes be referred to as a most significant control bit, because control signal C3 may control transistor 86-3 that draws the most current (e.g., thereby producing a smaller reference voltage than if control signal C1 or C2 were enabled). Control signal C1 may sometimes be referred to as a least significant control bit, because control signal C1 may control transistor 86-1 that draws the least current (e.g., thereby producing a larger reference voltage than if control signal C2 or C3 were enabled).

In step 102, control circuitry 82 may set all control signals that are provided to transistors 86 to logic zero. In other words, the control circuitry may de-assert control signals C1, C2, and C3 to disable transistors 86-1, 86-2, and 86-3 so that reference voltage signal VREF has a maximum voltage within the range of potential voltages that can be produced by reference voltage generation circuitry 52 (e.g., because reference voltage signal VREF has a maximum voltage when transistors 86 draw a minimum amount of current).

In step 104, control circuitry 82 may select the control signal that corresponds to the most significant control bit (e.g., the control signal that controls a transistor 86 that draws the most current when enabled). For example, the control circuitry may select control signal C3 that corresponds to transistor 86-3.

In step 106, control circuitry 82 may assert the selected control signal (e.g., by setting the selected control signal to logic one), thereby enabling a corresponding transistor 86 to draw current form power supply terminal 60-2. The current drawn by the corresponding transistor 86 may reduce the current reference voltage signal VREF by an amount equal to the current drawn multiplied by the resistance of resistor R6.

In step 108, control circuitry 82 may detect whether target voltage signal VT is greater than the current reference voltage signal VREF. For example, control circuitry 82 may determine whether target voltage signal VT is greater than the current reference voltage signal VREF based on the output signal produced by comparator 88. In response to determining that target voltage signal VT is greater than the current reference voltage signal VREF (e.g., that the output signal of comparator 88 is logic one), the operations of step 110 may be performed. In response to determining that the target voltage signal is less than or equal to the current reference voltage signal VREF (e.g., that the output signal of comparator 88 is logic zero), the operations of step 112 may be performed.

In step 110, control circuitry 82 may de-assert the selected control signal so that reference voltage signal VREF is restored to a previous value. The previous reference voltage signal value may be larger than target voltage signal VT. By de-asserting control signals during step 110, control circuitry 82 may ensure that reference voltage signal VREF has a value equal to or greater than the value of target voltage signal VT.

In step 112, control circuitry 82 may determine whether all control signals associated with transistors 86 have been processed (e.g., during steps 106-110). If any control signals remain to be processed, the operations of step 114 may be performed. If all control signals have been processed, calibration of reference voltage signal VREF may be complete and control circuitry 82 may assert a DONE signal during step 116 (e.g., the DONE signal may indicate to circuitry such as storage and processing circuitry 13 and/or circuitry 20 that calibration operations are finished).

In step 114, control circuitry 82 may select a control signal that corresponds to the next most significant control bit. The selected control signal may correspond to a transistor having the largest current draw that is less than the current draw of the transistor associated with the previously selected control signal. The process may then return to step 106 to process the selected control signal.

Figure 7:
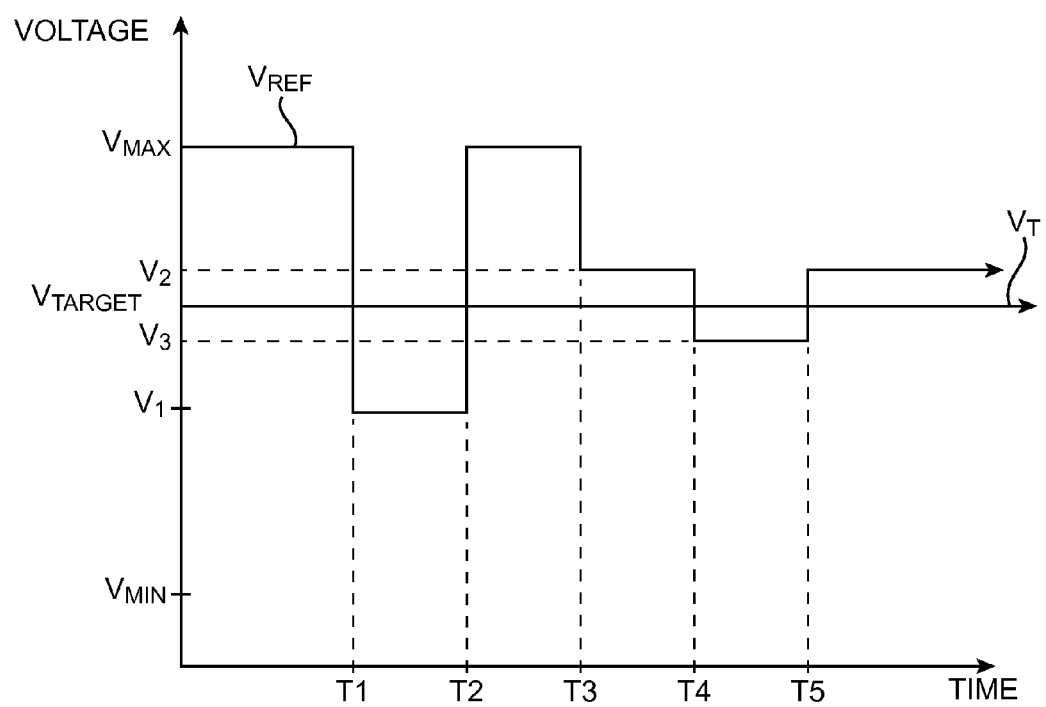
FIG. 7 is an illustrative graph showing how a reference voltage signal may be calibrated to correspond to a target reference voltage signal in accordance with an embodiment of the present invention.

FIG. 7 is a graph illustrating the operations of flowchart 100 for a scenario in which target voltage signal VT has a voltage VTARGET. In the scenario of FIG. 7, the differences between each pair of times T1, T2, T3, T4, and T5 may correspond to system clock periods (e.g., the time between time T1 and T2 may correspond to a period of system clock signal CLK). Before time T1, control circuitry 82 may de-assert all control signals that are provided to transistors 86, thereby producing a reference voltage signal VREF that has a maximum voltage VMAX (e.g., control circuitry 82 may perform step 102). In the scenario of FIG. 7, transistors 86 may be configured in a binary weighted configuration in which control signal C3 is the most significant bit, control signal C2 is the second most significant bit, and control signal C1 is the least significant bit (e.g., transistor 86-3 may draw the most current when enabled, transistor 86-2 may draw half of the current of transistor 86-3, and transistor 86-1 may draw one fourth of the current of transistor 86-3).

At time T1, control circuitry 82 may select most significant control bit C3 and set control bit C3 to logic one (e.g., control circuitry 82 may assert control signal C3 during steps 104 and 106). By asserting control bit C3, transistor 86-3 may be enabled to draw current and thereby reduce the voltage of reference voltage signal VREF to voltage V1.

Between times T1 and T2, control circuitry 82 may determine that voltage V1 is less than voltage VTARGET of target voltage signal VT and de-assert control signal C3 (e.g., during steps 108 and 110). By de-asserting control signal C3, the voltage of reference voltage signal VREF may be restored to voltage VMAX.

Between times T2 and T3, control circuitry 82 may determine that control signals C2 and C1 have not yet been processed, select control signal C2 (e.g., the next most significant control bit), and assert control signal C2. These operations may correspond to steps 112, 114, and 106. By asserting control signal C2, transistor 86-2 may be enabled so that the voltage of reference voltage signal VREF is reduced to voltage V2. The voltage decrease from voltage VMAX to voltage V2 may correspond to half of the voltage decrease from voltage VMAX to voltage V1, because transistor 86-2 draws half of the current that is drawn by transistor 86-3 when enabled.

Between times T3 and T4, control circuitry 82 may determine that voltage V2 is greater than voltage VTARGET of target voltage signal VT, determine that control signal C1 has not yet been processed, select control signal C1, and assert control signal C1 (e.g., during steps 108, 112, 114, and 106). By asserting control signal C1, corresponding transistor 86-1 may be enabled to draw current in addition to the current drawn by transistor 86-2, thereby reducing reference voltage signal VREF from voltage V2 to voltage V3.

Between times T4 and T5, control circuitry 82 may determine that voltage V3 is less than voltage VTARGET and de-assert control signal C3 (e.g., during steps 108 and 110). By de-asserting control signal C3, the voltage of reference voltage signal VREF may be restored to voltage V2.

After time T5, control circuitry 82 may determine that all control signals have been processed and assert signal DONE, thereby identifying that the calibration operations of flowchart 100 are complete.

The example of FIGS. 6 and 7 in which reference voltage signal VREF has a voltage that is greater than or equal to the voltage of detected reference voltage signal VT is merely illustrative. If desired, reference voltage generation circuitry 52 reference voltage signal VREF may be configured to ensure that reference voltage signal VREF has a voltage that is less than or equal to the voltage of detected reference voltage signal VT.

Figure 8:
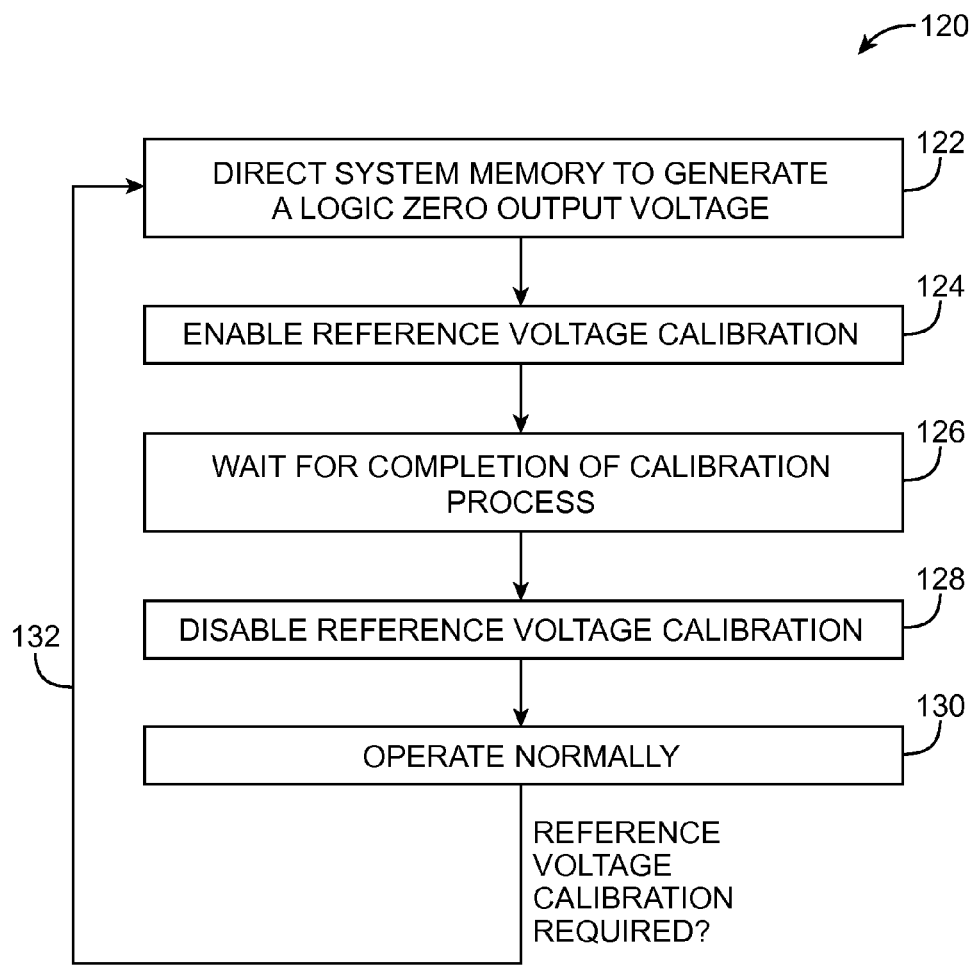
FIG. 8 is a flow chart of illustrative steps for calibrating a reference voltage signal that is used to receive signals from system memory in accordance with an embodiment of the present invention.

The calibration operations of flowchart 100 may be performed during initialization of device 10 or at any desired time during normal operation of device 10. FIG. 8 is a flowchart 120 of illustrative steps that may be performed by processing circuitry such as storage and processing circuitry 13 of memory controller 12, storage and processing circuitry 20, or other circuitry on device 10 that is operable to control receiver circuitry 18-1.

In step 122, the processing circuitry may direct system memory to generate a logic zero output voltage. For example, storage and processing circuitry 13 of FIG. 2 may provide control signals to driver circuitry 18-2 that directs driver circuitry 18-2 to provide control signals to system memory 14 over path 40-2. In this scenario, the control signals may direct system memory 14 to use driver circuitry 24-1 to produce a logic zero output voltage (e.g., by enabling pull-down circuit 44 and disabling pull-up circuit 42).

In step 124, the processing circuitry may enable reference voltage calibration. For example, the processing circuitry may assert enable signals EN1 and EN2 that are provided to termination circuit 46, detection circuitry 50, and reference voltage generation circuitry 52.

In step 126, the processing circuitry may wait for calibration operations to complete. For example, the processing circuitry may wait for a signal DONE (e.g., a signal that indicates completion of the calibration process of flowchart 100) to be asserted by reference voltage generation circuitry 52.

In step 128, the processing circuitry may disable reference voltage calibration. For example, the processing circuitry may de-assert enable signals EN1 and EN2 in response to receiving the DONE signal from reference voltage generation circuitry 52.

In step 130, the processing circuitry may operate normally. For example, the processing circuitry may direct memory controller 12 to receive memory access requests from processing and storage circuitry such as circuitry 20 and fulfill the received memory access requests by providing appropriate control and/or data signals to system memory 14 and receiving data signals from system memory 14 (e.g., by asserting enable signal EN1 that enables receiver circuitry 18-1 to receive signals from driver circuitry 24-1).

If additional reference voltage calibration is required, the process may return to step 122 via path 132. For example, if the source resistance of driver circuitry 24-1 or the termination resistance of receiver circuitry 18-1 is modified or changed during normal operation, additional reference voltage calibration may be required. As another example, a change in device operating temperatures may require additional reference voltage calibration.

If desired, reference voltage calibration may be performed in response to monitored information. For example, detection circuitry 50 may be periodically used to identify a desired target reference voltage and reference voltage calibration operations may be performed if the desired target reference voltage and the current reference voltage are not the same or differ by an amount greater than a predetermined voltage margin.

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit die that communicates with a memory that is external to the integrated circuit die, the integrated circuit die comprising:
    a port that receives a signal from the memory;
    detection circuitry coupled to the port, wherein the detection circuitry produces a target reference voltage signal based at least partly on the signal received at the port from the memory;
    reference circuitry that produces a reference voltage signal based on the target reference voltage signal; and
    a comparator that receives the signal from the memory through the port and the reference voltage signal and produces a corresponding output signal by comparing the signal from the memory to the reference voltage signal.

2. The integrated circuit die defined in claim 1 wherein the reference circuitry comprises a plurality of transistors coupled in parallel between a positive power supply terminal and a ground power supply terminal, wherein the reference circuitry produces the reference signal based at least partly on how much current is drawn by the plurality of transistors, and wherein the reference circuitry controls how much current is drawn by the plurality of transistors based at least partly on the target reference voltage signal.

3. The integrated circuit die defined in claim 2 wherein the reference circuitry further comprises a resistor interposed between the plurality of transistors and the positive power supply terminal.

4. The integrated circuit die defined in claim 2 wherein the reference circuitry further comprises:
    control circuitry that receives the target reference voltage signal and provides control signals to the plurality of transistors that selectively enable and selectively disable the plurality of transistors.

5. The integrated circuit die defined in claim 4 wherein the reference circuitry further comprises:
    a comparator circuit that receives the target reference voltage signal and the reference signal and provides a corresponding feedback signal to the control circuitry, wherein the control circuitry generates the control signals based on the feedback signal.

6. The integrated circuit die defined in claim 2 wherein the plurality of transistors each draws a different amount of current from the positive power supply terminal when enabled.

7. The integrated circuit die defined in claim 2 wherein the plurality of transistors comprises a plurality of binary weighted transistors.

8. The integrated circuit die defined in claim 1 wherein the detection circuitry comprises at least first and second resistors coupled between a positive power supply terminal and the port, wherein the at least first and second resistors form a voltage divider that produces the target reference voltage signal based on a voltage difference between the positive power supply terminal and the port.

9. An integrated circuit that communicates with an off-chip memory, the integrated circuit comprising:
    a port that receives a static voltage signal from the off-chip memory during a calibration procedure; and
    detection circuitry that, during the calibration procedure, produces a target reference voltage signal based at least partly on the static voltage signal received at the port from the off-chip memory.

10. The integrated circuit defined in claim 9 further comprising:
    reference circuitry having a plurality of transistors coupled in parallel between a positive power supply terminal and a ground power supply terminal, wherein the reference circuitry generates a reference voltage signal based on how much current is drawn by the plurality of transistors, and wherein the plurality of transistors draws the current based at least partly on the target reference voltage signal.

11. The integrated circuit defined in claim 10 further comprising:
    control circuitry that generates control signals that selectively enable and selectively disable the plurality of transistors based at least partly on the target reference voltage signal.

12. The integrated circuit defined in claim 11 further comprising:
    a comparator that receives the reference voltage signal and the target reference voltage signal and provides a corresponding comparator output signal to the control circuitry by comparing the reference voltage signal to the target reference voltage signal.

13. The integrated circuit defined in claim 10 wherein the detection circuitry comprises at least first and second resistors coupled between the positive power supply terminal and the port and wherein the at least first and second resistors form a voltage divider that produces the target reference voltage signal based on a voltage difference between the positive power supply terminal and the port.

14. The integrated circuit defined in claim 10 wherein the reference circuitry further comprises a resistor interposed between the positive power supply terminal and the plurality of transistors.

15. A method for using a memory controller coupled to a memory device that is separate from the memory controller, the method comprising:
    with the memory controller, directing the memory device to provide a logic zero output voltage to a port of the memory controller;
    receiving the logic zero output voltage with circuitry in the memory controller that is coupled to the port; and with the circuitry, generating a reference voltage signal based at least partly on the received logic zero output voltage.

16. The method defined in claim 15 further comprising:
with storage circuitry in the circuitry, storing the reference voltage signal.

17. The method defined in claim 15 further comprising:
with the memory controller, determining whether data signals that are received from the memory device at the port correspond to logic one values or logic zero values based on the stored reference voltage signal.

18. The method defined in claim 15 wherein the circuitry comprises detection circuitry, the method further comprising:
with the detection circuitry, receiving the logic zero output voltage and generating a target reference voltage signal based on the logic zero output voltage.

19. The method defined in claim 18 wherein the circuitry further comprises a comparator, the method further comprising:
with the comparator, receiving the target reference voltage signal and the reference voltage signal and producing a corresponding comparator output signal; and
with the circuitry, generating the reference voltage signal based at least partly on the comparator output signal.

20. The method defined in claim 19 wherein the circuitry further comprises a plurality of transistors coupled in parallel between a positive power supply terminal and a ground power supply terminal, wherein a resistor is interposed between the plurality of transistors and the positive power supply terminal, and wherein generating the reference voltage signal comprises:
with control circuitry in the circuitry, receiving the comparator output signal; and
with the control circuitry, providing control signals to the plurality of transistors that selectively enable and selectively disable the plurality of transistors to produce the reference voltage signal.

\* \* \* \* \*